United States Patent
Hwang (10) Patent No.: US 9,564,662 B2
(45) Date of Patent: Feb. 7, 2017

(54) PROTECTION CIRCUIT MODULE INTEGRATED CAP ASSEMBLY, AND METHOD OF MANUFACTURING CAP ASSEMBLY AND SECONDARY BATTERY

(71) Applicant: SAMSUNG SDI CO., LTD., Yongin-si, Gyeonggi-do (KR)

(72) Inventor: Yu-Sik Hwang, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 597 days.

(21) Appl. No.: 14/012,939

(22) Filed: Aug. 28, 2013

(65) Prior Publication Data
US 2014/0212699 A1    Jul. 31, 2014

(30) Foreign Application Priority Data

Jan. 29, 2013 (KR) .................. 10-2013-0010094

(51) Int. Cl.
H01M 10/42 (2006.01)
H05K 3/20 (2006.01)
H01M 2/04 (2006.01)

(52) U.S. Cl.
CPC ....... *H01M 10/4257* (2013.01); *H01M 2/0473* (2013.01); *H01M 2/0478* (2013.01);
(Continued)

(58) Field of Classification Search
CPC ............ H01M 10/425; H01M 10/4257; H01M 2010/4271
(Continued)

(56) References Cited

U.S. PATENT DOCUMENTS 7,235,334 B2   6/2007  Kim et al.
2008/0166637 A1   7/2008  Inagaki et al.
(Continued)

FOREIGN PATENT DOCUMENTS

JP   08-022839   1/1996
JP   2004-342607   12/2004
(Continued)

OTHER PUBLICATIONS

Patent Abstract of Japan, English machine translation of Japanese Publication No. JP 08-022839, 21 pages.
(Continued)

*Primary Examiner* — Jonathan G Leong
(74) *Attorney, Agent, or Firm* — Lewis Roca Rothgerber Christie LLP (57) ABSTRACT

A protection circuit module (PCM) integrated cap assembly includes a cap plate including an electrically conductive material and defining a through hole passing from a first surface of the cap plate to a second surface of the cap plate, a wiring unit including an electrically conductive material and a circuit pattern, and facing the first surface of the cap plate, wherein a first edge of the wiring unit is electrically coupled to the cap plate, and wherein a second edge of the wiring unit extends through the through hole of the cap plate a first insulating unit in a space of the circuit pattern a second insulating unit between the second edge of the wiring unit and a portion of the cap plate defining the through hole, and at least one electrical component coupled to the circuit pattern.

6 Claims, 5 Drawing Sheets

(52) U.S. Cl.
CPC .......... *H01M 10/425* (2013.01); *H05K 3/202* (2013.01); *H05K 2201/09118* (2013.01); *H05K 2201/10037* (2013.01); *H05K 2203/302* (2013.01); *Y10T 29/49108* (2015.01)

(58) Field of Classification Search
USPC ..................................................... 429/7, 175
See application file for complete search history.

(56) References Cited

U.S. PATENT DOCUMENTS

| | | | |
|---|---|---|---|
| 2008/0226979 A1* | 9/2008 | Jang | H01M 2/30 429/164 |
| 2011/0123839 A1* | 5/2011 | Lee | H01M 2/0275 429/7 |

FOREIGN PATENT DOCUMENTS

| | | |
|---|---|---|
| JP | 2007-173113 | 7/2007 |
| JP | 2008-186803 | 8/2008 |
| KR | 10-2005-0121172 | 12/2005 |
| KR | 10-2008-0061692 | 7/2008 |

OTHER PUBLICATIONS

Patent Abstract of Japan, English machine translation of Japanese Publication No. JP 2004-342607, 44 pages.
Patent Abstract of Japan, English machine translation of Japanese Publication No. JP 2007-173113, 28 pages.

\* cited by examiner

PROTECTION CIRCUIT MODULE INTEGRATED CAP ASSEMBLY, AND METHOD OF MANUFACTURING CAP ASSEMBLY AND SECONDARY BATTERY

CROSS-REFERENCE TO RELATED APPLICATION

This application claims priority to and the benefit of Korean Patent Application No. 10-2013-0010094, filed on Jan. 29, 2013, in the Korean Intellectual Property Office, the disclosure of which is incorporated herein in its entirety by reference.

BACKGROUND

1. Field

One or more embodiments of the present invention relate to secondary batteries.

2. Description of the Related Art

A secondary battery, or rechargeable battery, is both chargeable and dischargeable, and is distinguished from a primary battery, which is incapable of being recharged. The secondary battery is widely used in electronic fields related to mobile phones, smart phones, tablet personal computers (PCs), digital cameras, electric vehicles, electric bicycles, and uninterruptible power systems (UPSs).

Secondary batteries may be divided into a can-type secondary battery, which may be cylindrically shaped or angularly shaped, and a pouch-type secondary battery, which has flexibility according to the shape of a case in which the secondary battery is accommodated.

In the case of the angularly shaped (e.g., angled shape) secondary battery disclosed in Korean Patent Publication No. 2011-0016394 (Feb. 17, 2011), a cap assembly is combined with a cell, and a protection circuit module (PCM) integrated cap assembly is combined with the cap assembly. Because the PCM integrated cap assembly should be mechanically and electrically coupled to the cap assembly, a welding process or a bolting process is applied to the connection between the PCM integrated cap assembly and the cap assembly. To weld the PCM integrated cap assembly to the cap assembly, special equipment may be used, and also, in the case of the bolting process, additional parts, such as bolts, and additional work are needed. Accordingly, from a perspective of workability and costs, the welding process and the bolting process are inefficient.

SUMMARY

One or more embodiments of the present invention include protection circuit module integrated cap assemblies, methods of manufacturing a cap assembly, and secondary batteries.

One or more embodiments of the present invention include cap assemblies that do not need additional connection work, such as welding or bolting, to couple a protection circuit module integrated cap assembly to a cap assembly, methods of manufacturing the cap assembly, and secondary batteries having the cap assembly.

Additional aspects will be set forth in part in the description which follows and, in part, will be apparent from the description, or may be learned by practice of the presented embodiments.

According to one or more embodiments of the present invention, there is provided a protection circuit module (PCM) integrated cap assembly including a cap plate including an electrically conductive material and defining a through hole passing from a first surface of the cap plate to a second surface of the cap plate, a wiring unit including an electrically conductive material and a circuit pattern, and facing the first surface of the cap plate, wherein a first edge of the wiring unit is electrically coupled to the cap plate, and wherein a second edge of the wiring unit extends through the through hole of the cap plate a first insulating unit in a space of the circuit pattern a second insulating unit between the second edge of the wiring unit and a portion of the cap plate defining the through hole, and at least one electrical component coupled to the circuit pattern.

The cap plate and the wiring unit may collectively be a bent plate.

The PCM integrated cap assembly may further include a connection unit bent from an edge of the cap plate and electrically coupled to the first edge of the wiring unit.

The circuit pattern may include an etched material.

Outer corners of the cap plate may include a curved surface.

The second edge of the wiring unit may include a portion bent towards the cap plate.

The PCM integrated cap assembly may further include a terminal plate including an electrically conductive material and located at the second insulating unit and electrically coupled to the second edge of the wiring unit, and the second insulating unit may extend to the second surface of the cap plate and may surround the second edge of the wiring unit.

The circuit pattern may include a plurality of terminal units exposed at a surface of the first insulating unit facing away from the cap plate.

According to one or more embodiments of the present invention, there is provided a secondary battery including a can defining an opening, an electrode assembly in the can, and a PCM integrated cap assembly that covers the opening of the can and includes a cap plate including an electrically conductive material and defining a through hole passing from a first surface of the cap plate to a second surface of the cap plate, a wiring unit facing the first surface of the cap plate and including an electrically conductive material and a circuit pattern, wherein a first edge of the wiring unit is coupled to the cap plate, and wherein a second edge of the wiring unit passes through the through hole to extend beyond the second surface of the cap plate, a first insulating unit in a space of the circuit pattern, a second insulating unit between the second edge of the wiring unit and a portion of the cap plate defining the through hole, and at least one electrical component coupled to the circuit pattern.

The cap plate and the wiring unit may collectively form a bent plate.

The first edge of the wiring unit may be coupled to a connection unit bent from an edge of the cap plate.

The circuit pattern may include the electrically conductive material to which an etching process has been applied.

Corners of the cap plate may include a curved surface.

The second edge of the wiring unit may be bent towards the cap plate.

The second insulating unit may extend to the second surface of the cap plate and may surround the second edge of the wiring unit, and the secondary battery may further include a terminal plate that includes an electrically conductive material, that is located at the second insulating unit, and that is coupled to the second edge of the wiring unit.

The secondary battery may further include an over-temperature protection device electrically coupled between the terminal plate and an electrode of the electrode assembly.

The circuit pattern may include a plurality of terminal units including exposed surfaces.

The secondary battery may further include an upper cover combined with the can at the opening of the can to cover the PCM integrated cap assembly, the upper cover including a plurality of terminal holes corresponding to a plurality of terminal units.

According to one or more embodiments of the present invention, there is provided a method of manufacturing a PCM integrated cap assembly, the method including providing a substrate including an electrically conductive material, removing a portion of the substrate to form a cap plate defining a through hole that passes from a first surface of the cap plate to a second surface of the cap plate, a wiring unit, and a connection unit between the cap plate and a first edge of the wiring unit, etching the wiring unit to form a circuit pattern, bending the connection unit so that the wiring unit and the cap plate face each other, bending a second edge of the wiring unit to pass the second edge of the wiring unit through the through hole of the cap plate, forming a first insulating unit in a portion of a space in the circuit pattern, and forming a second insulating unit between the second edge of the wiring unit and a portion of the cap plate defining the through hole.

The method may further include performing a corner-cutting process to form a curved surface on each corner of the wiring unit.

In the PCM integrated cap assembly, the method of manufacturing the PCM integrated cap assembly, and the secondary battery according to embodiments of the current invention, a PCM is formed with a cap assembly as a single body, and thus, additional connection work, such as a welding process that is otherwise essential for coupling the cap assembly and the PCM, is unnecessary. Therefore, the manufacture of a secondary battery is simplified, and accordingly, manufacturing costs and time may be reduced.

Also, an overall structure of the secondary battery is stable by using the PCM integrated cap assembly in which the cap plate and the wiring unit are formed as a one-body device, and thus, product reliability is better than a combining method in the related art, in which a precise connection between the cap assembly and the PCM is relatively difficult.

BRIEF DESCRIPTION OF THE DRAWINGS

These and/or other aspects will become apparent and more readily appreciated from the following description of embodiments of the present invention, taken in conjunction with the accompanying drawings, of which.

DETAILED DESCRIPTION

Embodiments of the present invention will now be described more fully with reference to the accompanying drawings, in which exemplary embodiments of the invention are shown. However, embodiments of the invention may be embodied in many different forms, and should not be construed as being limited to the embodiments set forth herein. The provided embodiments ensure that this disclosure will be thorough and complete, and will fully convey the concept of the invention to those of ordinary skill in the art, and thus, embodiments of the present invention are defined by the scope of the claims and their equivalents. The terminologies used herein are for the purpose of describing particular embodiments only, and are not intended to limit the inventive concept. As used herein, the singular forms "a," "an," and "the" are intended to include the plural forms as well, unless the context clearly indicates otherwise. It will be further understood that the terms "comprise" and/or "comprising," when used in this specification, indicate the presence of stated features, integers, steps, operations, elements, and/or components, but do not preclude the presence or addition of one or more other features, integers, steps, operations, elements, and/or components, and/or groups thereof. It will be understood that, although the terms first, second, etc. may be used herein to describe various elements, these elements should not be limited by these terms. Instead, these terms are only used to distinguish one element from another.

Figure 1:
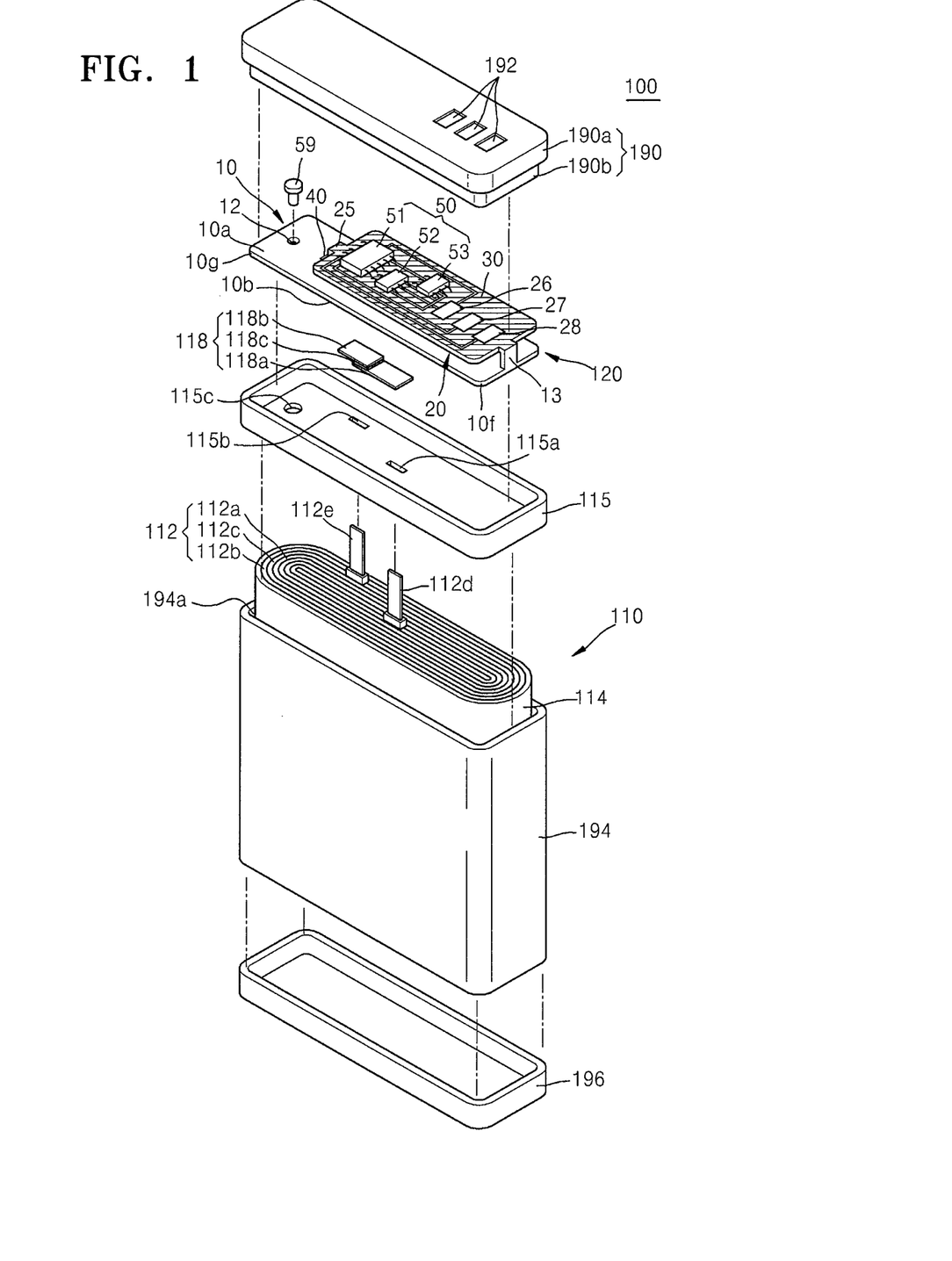
FIG. 1 is a schematic exploded perspective view illustrating a connection of constituent elements of a secondary battery according to an embodiment of the present invention.

FIG. 1 is a schematic exploded perspective view showing a connection of constituent elements of a secondary battery 100 according to an embodiment of the present invention. The secondary battery 100 of FIG. 1 includes a protection circuit module (PCM) integrated cap assembly 120 that is combined with a bare cell 110 at an opening 194a of a can 194. The bare cell 110 includes a can 194 that is formed of an electrically conductive material and has the opening 194a, and an electrode assembly 112 accommodated in the can 194.

The can 194 has the opening 194a at an upper portion thereof so that the electrode assembly 112 can be inserted in the can 194. The can 194 is formed of an electrically conductive material, such as aluminum, protects the electrode assembly 112 from external impact, and dissipates (e.g., to an exterior of the can) heat generated by charging and discharging the electrode assembly 112.

The electrode assembly 112, which includes first and second electrodes 112a and 112b with a separator 112c therebetween, is accommodated in the can 194 of the bare cell 110. An electrode active material is coated on surfaces of the first and second electrodes 112a and 112b.

As depicted in FIG. 1, the electrode assembly 112 may be formed by winding in a jelly-roll manner. However, the present embodiment is not limited thereto. For example, the electrode assembly 112 may be formed by stacking the first electrode 112a, the separator 112c, and the second electrode 112b.

In the present embodiment, the first electrode 112a of the electrode assembly 112 may be a cathode electrode, and the second electrode 112b may be an anode electrode, although in alternative embodiments, the first electrode 112a may be an anode electrode and the second electrode 112b may be a cathode electrode.

The electrode assembly 112 includes a first electrode tap 112d electrically coupled to the first electrode 112a, and a second electrode tap 112e electrically coupled to the second electrode 112b.

The electrode assembly 112 is accommodated in the can 194 and is soaked in an electrolyte. After the electrode assembly 112 is placed in the can 194, the opening 194a of the can 194 may be sealed by using the PCM integrated cap assembly 120.

An insulating plate 115 may be located between the electrode assembly 112 and the PCM integrated cap assembly 120. The insulating plate 115 holds the electrode assembly 112 so that the electrode assembly 112 does not move within the can 194, and also acts as an insulator between the electrode assembly 112 and the cap assembly 120. The insulating plate 115 has a first through hole 115a and a second through hole 115b through which the first electrode tap 112d and the second electrode tap 112e respectively pass, and an electrolyte inlet 115c to enable the injection of the electrolyte.

Figure 2:
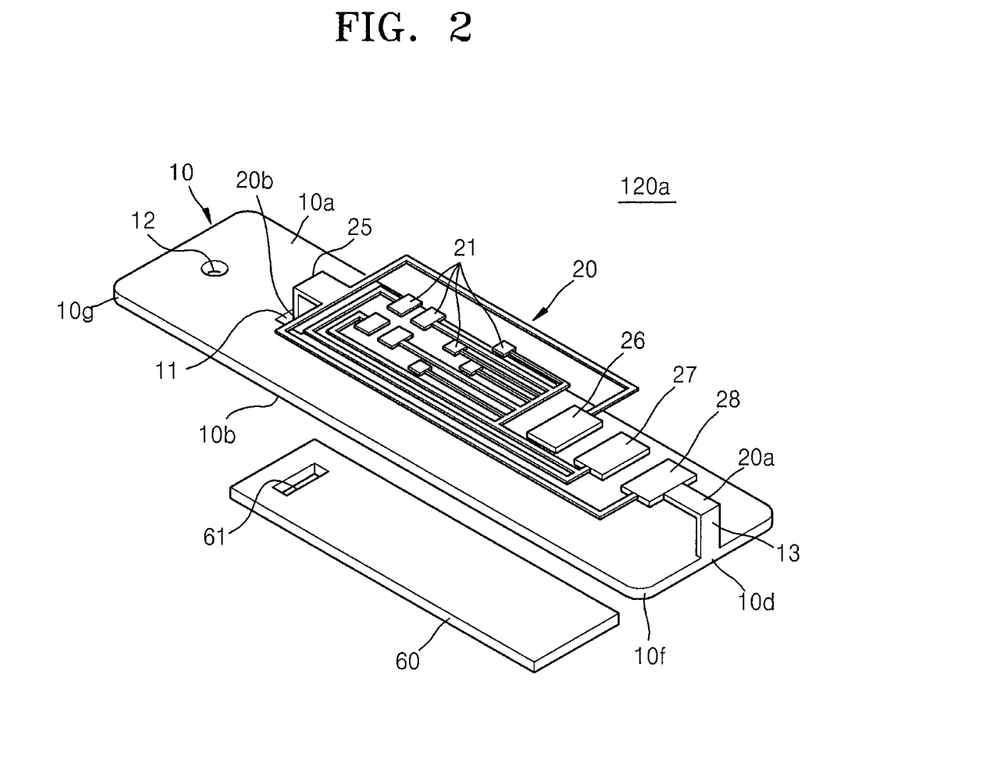
FIG. 2 is a schematic perspective view illustrating a portion of a process of manufacturing a cap assembly included in the secondary battery of the embodiment shown in FIG. 1.
Figure 3:
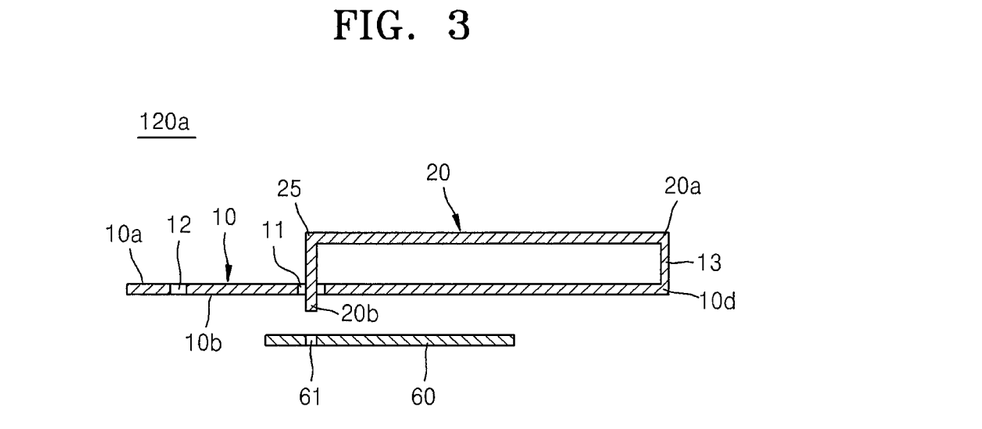
FIG. 3 is a lateral cross-sectional view of a cap substrate of the embodiment shown in FIG. 2.
Figure 4:
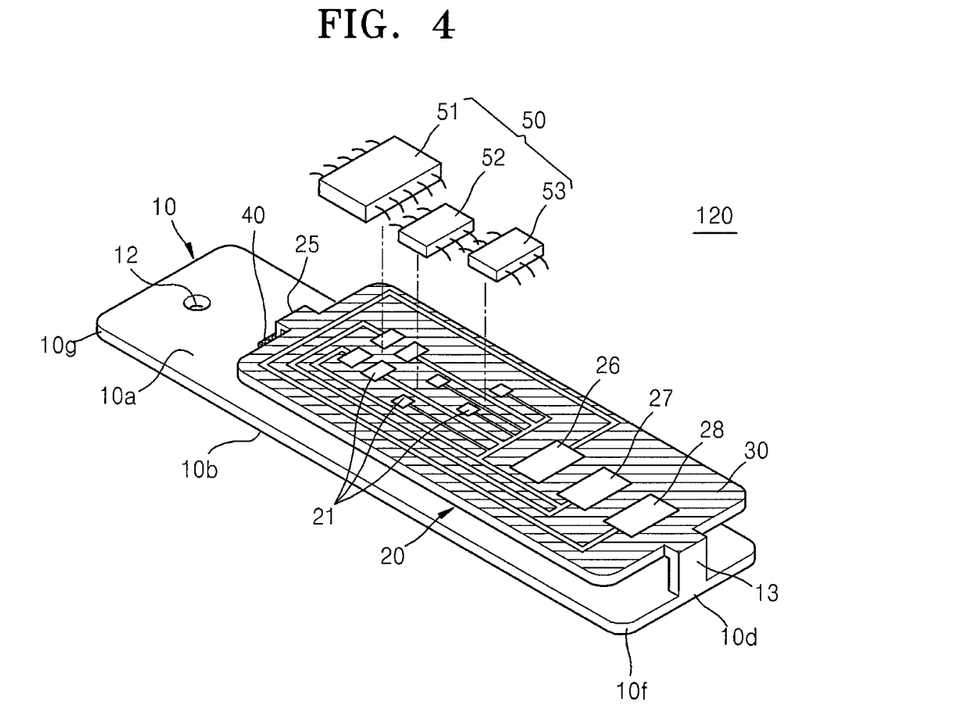
FIG. 4 is a schematic perspective view illustrating a portion of a process of manufacturing the cap assembly of the embodiment shown in FIG. 1.
Figure 5:
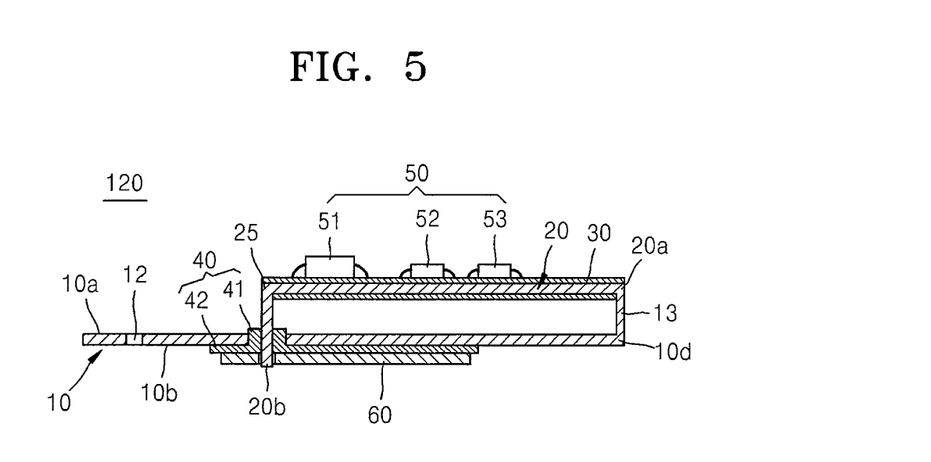
FIG. 5 is a lateral cross-sectional view of the cap substrate of the embodiment shown in FIG. 4.

FIG. 2 is a schematic perspective view illustrating a portion of a process of manufacturing the cap assembly 120 included in the secondary battery of the embodiment shown in FIG. 1. FIG. 3 is a lateral cross-sectional view of a cap substrate of the embodiment shown in FIG. 2. FIG. 4 is a schematic perspective view illustrating a portion of a process of manufacturing the cap assembly 120 of the embodiment shown in FIG. 1. FIG. 5 is a lateral cross-sectional view of the cap substrate of the embodiment shown in FIG. 4.

The PCM integrated cap assembly 120 of the present embodiment may be manufactured by using a cap substrate 120a, as depicted in FIGS. 2 and 3. That is, the PCM integrated cap assembly 120 depicted in FIG. 5 may be completed by forming the cap substrate 120a of FIGS. 2 and 3 with a moldable resin.

The PCM integrated cap assembly 120 includes a cap plate 10 formed of an electrically conductive material, a wiring unit 20 that includes a circuit pattern 21 and is coupled to the cap plate 10, a first insulating unit 30 filled in the circuit pattern 21 of the wiring unit 20, a second insulating unit 40 filled between the cap plate 10 and the wiring unit 20, and electric parts 50 mounted on the circuit pattern 21 of the wiring unit 20.

The first insulating unit 30 and the second insulating unit 40 may be formed of a moldable resin. For example, the first insulating unit 30 and the second insulating unit 40 may be one or more of polyvinyl chloride (PVC), polystyrene (PS), polypropylene (PP), polyamide (PAM), polycarbonate (PC), polyarylate (PAR), polyimide (PI), fluorine resin, and epoxy resin, although the present invention is not limited thereto.

The cap substrate 120a of FIGS. 2 and 3 may manufactured by bending, for example, an electrically conductive material such as nickel, aluminum, nickel plated aluminum, nickel plated copper, and nickel plated iron, although the material for forming the cap substrate 120a according to the present invention is not limited thereto. The cap plate 10 is located on a lower side of the cap substrate 120a, and the wiring unit 20 is located on an upper side of the cap substrate 120a. The cap plate 10 includes a through hole 11 penetrating from one surface 10a to the other surface 10b.

The wiring unit 20 includes the circuit pattern 21 and faces a surface of the cap plate 10. An end/edge/edge unit 20a of the wiring unit 20 is electrically coupled to a connection unit 13 that is bent from an end/edge/edge unit 10d of the cap plate 10.

The other/second end/edge/edge unit 20b of the wiring unit 20 corresponds to a bend/bent portion/bending unit 25 formed by bending a portion of the wiring unit 20 toward the cap plate 10. The other edge unit 20b of the wiring unit 20 protrudes to the other surface 10b of the cap plate 10 by passing through the through hole 11 of the cap plate 10.

The circuit pattern 21 of the wiring unit 20 may be formed by applying an etching process to a plate made of an electrically conductive material. The etching process removes regions from the plate of an electrically conductive material, leaving a remaining region where the circuit pattern 21 is formed, by coating a resist on the region where the circuit pattern 21 is to be formed, and by then applying a corrosive solution to the electrically conductive material plate. The circuit pattern 21 depicted in the drawings is an example for describing the present embodiment, and thus, may be modified in various ways according to the connection of electrical parts.

The circuit pattern 21 of the wiring unit 20 includes a plurality of terminal units (e.g., electrical terminals) 26, 27, and 28 having an upper surface that is exposed after filling the first insulating unit 30.

Outer corners 10f and 10g of the cap plate 10 may undergo a corner-cutting process to form curved corners that correspond to the shape of inner corners at the opening 194a of the can 194 of FIG. 1. Also, the cap plate 10 includes an electrolyte inlet 12 at a location corresponding to the electrolyte inlet 115c of the insulating plate 115 shown in FIG. 1. After the PCM integrated cap assembly 120 is combined with the can 194 at the opening 194a of the can 194, an electrolyte is injected through the electrolyte inlet 12, and afterwards, the electrolyte inlet 12 is sealed with a lid or stopper 59, as shown in FIG. 1.

In FIGS. 4 and 5, the PCM integrated cap assembly 120 completed by applying a molding resin to the cap substrate 120a of FIGS. 2 and 3 is shown. The PCM integrated cap assembly 120 includes the first insulating unit 30 that is formed by filing the molding resin in at least a portion of space between the circuit patterns 21 of the wiring unit 20. The first insulating unit 30 supports the circuit pattern 21 and electrically insulates the circuit pattern 21 from other constituent elements.

The PCM integrated cap assembly 120 includes the second insulating unit 40 that is formed by filling the molding resin in a space between the through hole 11 of the cap plate 10 and the other edge unit 20b of the wiring unit 20. The second insulating unit 40 includes an opening insulating unit 41, which surrounds the other edge unit 20b of the wiring unit 20, and a surface insulating unit 42, which extends along at least a portion of the other surface 10b of the cap plate 10.

A terminal plate 60 formed of an electrically conductive material is located on the surface insulating unit 42 opposite the other surface 10b of the cap plate 10. The terminal plate 60 may be one or more of nickel, aluminum, nickel plated aluminum, nickel plated copper, and nickel plated iron, although the material for forming the terminal plate 60 of the present embodiment is not limited thereto.

Referring to FIG. 1, the PCM integrated cap assembly 120 may include an over-temperature protection device 118 that is electrically coupled to the terminal plate 60. The over-temperature protection device 118 prevents an overcurrent from flowing in the bare cell 110 when the bare cell 110 is charged or discharged, and may be located between the first electrode tap 112*d* and the terminal plate 60.

The over-temperature protection device 118 includes a first lead wire 118*a* electrically coupled to the first electrode tap 112*d*, a second lead wire 118*b* electrically coupled to the terminal plate 60, and a positive temperature coefficient (PTC) device 118*c* located between the first and second lead wires 118*a* and 118*b*.

The electrical resistance of the PTC device 118*c* rapidly increases when a temperature of the PTC device 118*c* increases, and the PTC device 118*c* detects heat generated from the bare cell 110 (e.g., if the heat of the bare cell 110 increases, the heat of the PTC device 118*c* also increases). Although not shown, the PTC device 118*c* may include a fuse.

The PCM integrated cap assembly 120 also includes an electrical part/electrical component 50 that is electrically mounted on the circuit pattern 21. The electrical part 50 includes a first part 51, a second part 52, and a third part 53 that are electrically coupled to the circuit pattern 21. However, the number, as well as the arrangement, of parts included in the electrical part 50 of the present embodiment are not limited to the above description, and thus, the number and arrangement of parts included in the electrical part 50 may vary.

The electrical part 50 functions as a protection circuit module (PCM) for stably charging and discharging the bare cell 110 when the bare cell 110 is charged and discharged. The electrical part 50 may include devices such as a control IC and a charging/discharging switch, and controls charging and discharging of the secondary battery 100.

The plural terminal units 26, 27, and 28 of the wiring unit 20 enable the secondary battery 100 to be electrically coupled to an external power source or to an external device.

Referring to FIG. 1, the secondary battery 100 includes an upper cover 190 and a lower cover 196. The upper cover 190 includes a cover plate 190*a*, which covers an upper side of the PCM integrated cap assembly 120, and a cover sidewall 190*b* that extends downwardly from the cover plate 190*a*. The cover plate 190*a* includes a plurality of terminal holes 192 that expose the plural terminal units 26, 27, and 28 of the PCM integrated cap assembly 120. The lower cover 196 surrounds a lower side/lower portion of the bare cell 110 to protect the bare cell 110.

The first electrode tap 112*d* of the electrode assembly 112 is electrically coupled to the over-temperature protection device 118, and the second electrode tap 112*e* is electrically coupled to the cap plate 10. Accordingly, the first electrode tap 112*d* of the electrode assembly 112 is electrically coupled to the wiring unit 20 through the over-temperature protection device 118 and the terminal plate 60.

The secondary battery 100 having the structure described above may be assembled by coupling the PCM integrated cap assembly 120, in which the cap plate 10 that seals the can 194 is formed as a single-body component with the wiring unit 20, to the bare cell 110.

In the related art, a PCM integrated cap assembly is electrically coupled to a cap assembly by welding, and thus, the connection work is complicated and has a high cost. However, the secondary battery 100 of the present embodiment needs no welding, which is an essential process for electrical connection in the related art. Accordingly, the manufacture of the secondary battery 100 is simplified, and costs and time for manufacturing the secondary battery 100 are reduced. Also, in the present embodiment, because the PCM integrated cap assembly 120 in which the cap plate 10 is formed as single-body device with the wiring unit 20 is used, an overall structure of the secondary battery 100 is stable, and thus, reliability of product is better than a related art product that is manufactured using a welding method, and in which a precise connection between the cap assembly and the PCM is difficult to obtain.

Figure 6A:
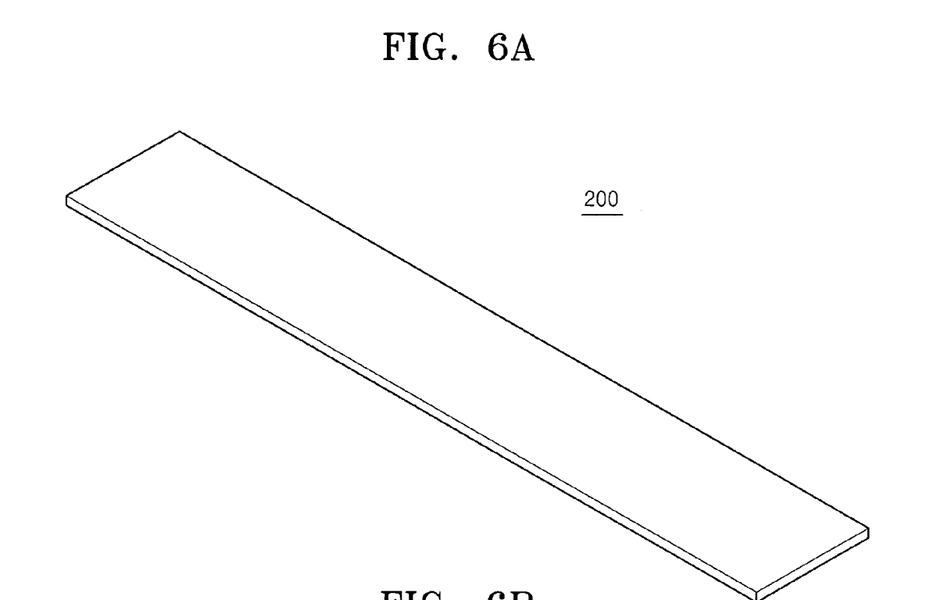
FIG. 6A is a schematic perspective view illustrating a portion of a process of manufacturing the cap assembly included in the secondary battery of the embodiment shown in FIG. 1.
Figure 6B:
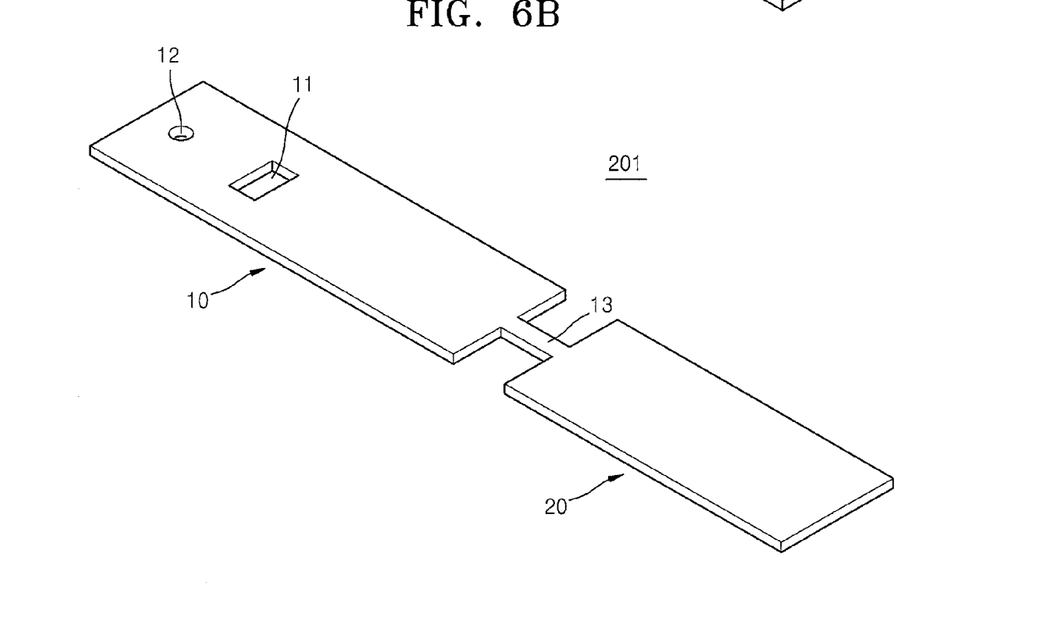
FIG. 6B is a schematic perspective view illustrating a cap substrate, to which some processes are performed, of the embodiment shown in FIG. 6A.
Figure 6C:
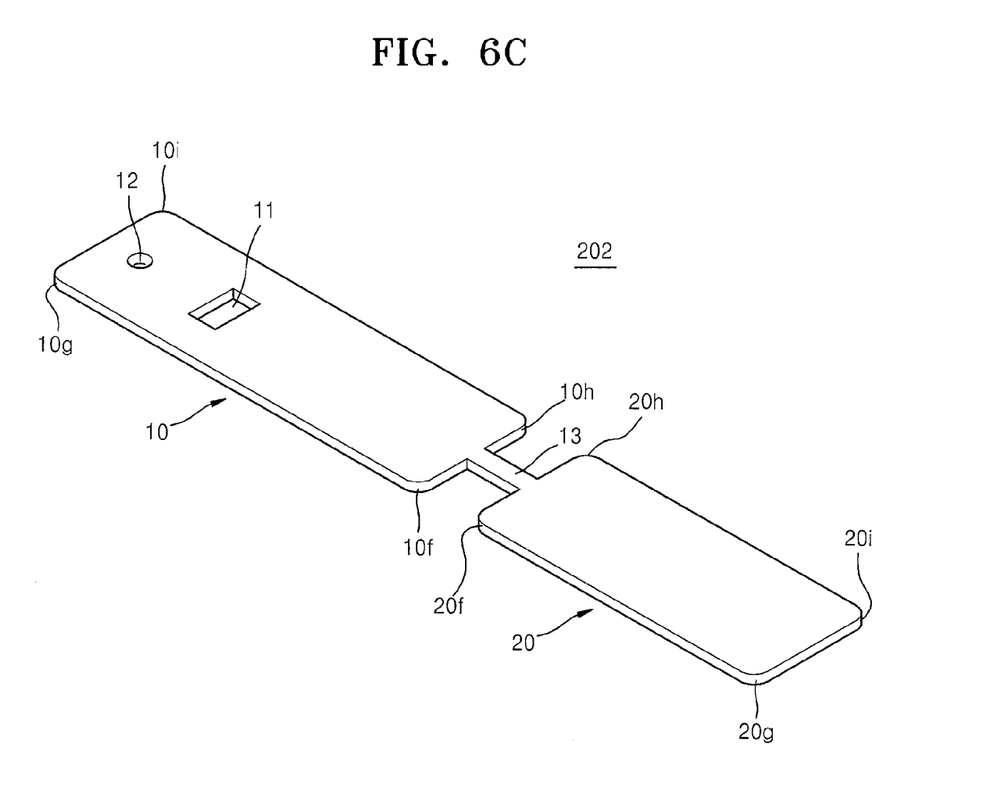
FIG. 6C is a schematic perspective view illustrating the cap substrate, to which, in addition to the processes illustrated by the embodiment of FIG. 6B, further processes are performed.

FIG. 6A is a schematic perspective view illustrating a substrate used in a portion of a process of manufacturing the cap assembly included in the secondary battery of the embodiment shown in FIG. 1. FIG. 6B is a schematic perspective view illustrating a cap substrate resulting from performing some processes to the substrate of FIG. 6A. FIG. 6C is a schematic perspective view illustrating the cap substrate of FIG. 6B after additional processes are performed thereon.

The method of manufacturing a PCM integrated cap assembly of the embodiment shown in FIGS. 6A through 6C includes: preparing a substrate 200 formed of an electrically conductive material, as depicted in FIG. 6A; forming a first processed substrate 201, as depicted in FIG. 6B, by forming a connection unit 13, a through hole 11, and an electrolyte inlet 12 in the substrate 200; and forming a second processed substrate 202, as depicted in FIG. 6C, by applying a corner-cutting process on the first processed substrate 201.

A press process may be used to form the first processed substrate 201 in FIG. 6B by forming the connection unit 13, the through hole 11, and the electrolyte inlet 12 in the substrate 200 of FIG. 6A, which may be formed of an electrically conductive material. The connection unit 13, the through hole 11, and the electrolyte inlet 12 may be formed using a pre-manufactured mold to remove some portions of the substrate 200 formed of an electrically conductive material.

The first processed substrate 201 depicted in FIG. 6B may include the cap plate 10, the wiring unit 20, and the connection unit 13 that couples the cap plate 10 to the wiring unit 20.

When the first processed substrate 201 of FIG. 6B is manufactured, a corner-cutting process is performed to form four corners 20*f*, 20*g*, 20*h*, and 20*i* of the wiring unit 20 and four corners 10*f*, 10*g*, 10*h*, and 10*i* of the cap plate 10 to be curved surfaces (e.g., rounded corners). The corner-cutting process may be performed by grinding the four corners 20*f*, 20*g*, 20*h*, and 20*i* of the wiring unit 20 and the four corners 10*f*, 10*g*, 10*h*, and 10*i* of the cap plate 10. However, the corner-cutting process according to the present embodiment is not limited thereto. For example, the corner-cutting process may be performed with the press process for forming the connection unit 13, the through hole 11, and the electrolyte inlet 12 in the substrate 200.

When the second processed substrate 202 in FIG. 6C is manufactured, processes may be performed, such as: applying an etching process to the wiring unit 20; forming the cap substrate 120*a* depicted in FIG. 2 by bending the second processed substrate 202; molding the cap substrate 120*a* depicted in FIG. 4 by using a resin; and mounting the electric parts 50 on the cap substrate 120*a*.

As a method of manufacturing the PCM integrated cap assembly 120 described above, a process is described as an example. However, the method of manufacturing the PCM integrated cap assembly 120 according to the present embodiment is not limited thereto, for example, the cap substrate 120*a* depicted in FIG. 2 may be manufactured by using a casting method.

It should be understood that the exemplary embodiments described above should be considered in a descriptive sense only, and not for purposes of limitation. Descriptions of features or aspects within each embodiment should typically be considered as available for other similar features or aspects in other embodiments.

What is claimed is:

1. A protection circuit module (PCM) integrated cap assembly comprising:
   a cap plate comprising an electrically conductive material and defining a through hole passing from a first surface of the cap plate to a second surface of the cap plate;
   a wiring unit comprising an electrically conductive material and a circuit pattern, and facing the first surface of the cap plate, wherein a first edge of the wiring unit is electrically coupled to the cap plate, and wherein a second edge of the wiring unit extends through the through hole of the cap plate;
   a first insulating unit in a space of the circuit pattern;
   a second insulating unit between the second edge of the wiring unit and a portion of the cap plate defining the through hole;
   at least one electrical component coupled to the circuit pattern; and
   a connection unit bent from the first edge of the wiring unit and also bent from an edge of the cap plate,
   wherein the cap plate and the wiring unit are collectively formed from a single substrate.

2. The PCM integrated cap assembly of claim 1, wherein the circuit pattern comprises an etched material.

3. The PCM integrated cap assembly of claim 1, wherein outer corners of the cap plate comprise a curved surface.

4. The PCM integrated cap assembly of claim 1, wherein the second edge of the wiring unit comprises a portion bent towards the cap plate.

5. The PCM integrated cap assembly of claim 4, further comprising a terminal plate comprising an electrically conductive material and located at the second insulating unit and electrically coupled to the second edge of the wiring unit, and
   wherein the second insulating unit extends to the second surface of the cap plate and surrounds the second edge of the wiring unit.

6. The PCM integrated cap assembly of claim 1, wherein the circuit pattern comprises a plurality of terminal units exposed at a surface of the first insulating unit facing away from the cap plate.

* * * * *